(12) United States Patent
Pangal et al.

(10) Patent No.: US 9,857,992 B2
(45) Date of Patent: *Jan. 2, 2018

(54) DYNAMIC WINDOW TO IMPROVE NAND ENDURANCE

(71) Applicant: Intel Corporation, Santa Clara, CA (US)

(72) Inventors: Kiran Pangal, Fremont, CA (US); Ravi J. Kumar, Redwood City, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/076,963

(22) Filed: Mar. 22, 2016

(65) Prior Publication Data

US 2016/0357458 A1 Dec. 8, 2016

Related U.S. Application Data

(63) Continuation of application No. 13/997,212, filed as application No. PCT/US2011/067810 on Dec. 29, 2011, now Pat. No. 9,330,784.

(51) Int. Cl.
*G11C 29/02* (2006.01)
*G11C 29/50* (2006.01)
(Continued)

(52) U.S. Cl.
CPC ............ *G06F 3/0616* (2013.01); *G06F 3/064* (2013.01); *G06F 3/0653* (2013.01);
(Continued)

(58) Field of Classification Search
CPC ................ G11C 29/028; G11C 29/026; G11C 2029/0401; G11C 29/50016
See application file for complete search history.

(56) References Cited

U.S. PATENT DOCUMENTS 5,214,606 A * 5/1993 Hashimoto ............ G11C 16/08
365/185.11
5,574,684 A * 11/1996 Tomoeda ............... G11C 16/10
365/185.04
(Continued)

FOREIGN PATENT DOCUMENTS

| JP | 2006-065973 A | 9/2006 |
| KR | 10-1654030 B1 | 8/2016 |
| WO | 2013/101043 A1 | 7/2013 |

OTHER PUBLICATIONS

Office Action received for Korean Patent Application No. 10-2014-7014561, dated Nov. 17, 2015, 5 pages including 1 page of English translation.

(Continued)

*Primary Examiner* — Joseph D Torres
(74) *Attorney, Agent, or Firm* — Alpine Technology Law Group LLC

(57) ABSTRACT

Methods and apparatus to provide dynamic window to improve NAND (Not And) memory endurance are described. In one embodiment, a program-erase window associated with a NAND memory device is dynamically varied by starting with a higher erase verify (TEV) voltage and lowering the TEV voltage with subsequent cycles over a life of the NAND memory device based on a current cycle count value. Alternatively, the program-erase window is dynamically varied by starting with a higher erase verify (PV) voltage and erase verify (TEV) voltage and lowering the PV and TEV voltages with subsequent cycles over a life of the NAND memory device based on the current cycle count value. Other embodiments are also disclosed and claimed.

16 Claims, 6 Drawing Sheets

(51) Int. Cl.
| | |
|---|---|
| *G11C 29/10* | (2006.01) |
| *G11C 29/04* | (2006.01) |
| *G06F 3/06* | (2006.01) |
| *G06F 11/10* | (2006.01) |
| *G06F 11/20* | (2006.01) |
| *G11C 11/56* | (2006.01) |
| *G11C 16/14* | (2006.01) |
| *G11C 16/26* | (2006.01) |
| *G11C 16/34* | (2006.01) |
| *G11C 29/52* | (2006.01) |
| *G11C 16/00* | (2006.01) |

(52) U.S. Cl.
CPC .......... *G06F 3/0659* (2013.01); *G06F 3/0679* (2013.01); *G06F 11/1068* (2013.01); *G06F 11/2094* (2013.01); *G11C 11/5635* (2013.01); *G11C 11/5642* (2013.01); *G11C 16/14* (2013.01); *G11C 16/26* (2013.01); *G11C 16/3436* (2013.01); *G11C 29/021* (2013.01); *G11C 29/026* (2013.01); *G11C 29/028* (2013.01); *G11C 29/50016* (2013.01); *G11C 29/52* (2013.01); *G11C 16/00* (2013.01); *G11C 2029/0401* (2013.01)

(56) References Cited

U.S. PATENT DOCUMENTS

| | | | | |
|---|---|---|---|---|
| 5,696,756 A * | 12/1997 | Fujimoto | ........... | G11B 7/00375 369/275.3 |
| 5,748,545 A * | 5/1998 | Lee | ........ | G11C 29/02 365/189.11 |
| 6,026,023 A * | 2/2000 | Tonda | .......... | G11C 5/147 365/185.2 |
| 6,243,686 B1 * | 6/2001 | McPherson | ........... | G06K 19/07 704/270 |
| 6,552,929 B1 * | 4/2003 | Parker | .......... | G11C 16/12 365/185.03 |
| 9,330,784 B2 | 5/2016 | Pangal et al. | | |
| 2002/0021583 A1 * | 2/2002 | Yoshida | ............ | G11C 16/3436 365/185.22 |
| 2002/0108073 A1 * | 8/2002 | Hughes | ............ | G11C 29/44 714/6.32 |
| 2008/0013360 A1 * | 1/2008 | Hemink | ............ | G11C 11/5635 365/100 |
| 2008/0019164 A1 * | 1/2008 | Hemink | ............ | G11C 16/344 365/100 |
| 2008/0089132 A1 * | 4/2008 | Ito | ............ | G11C 16/3477 365/185.22 |
| 2008/0089133 A1 * | 4/2008 | Ito | ............ | G11C 8/10 365/185.22 |
| 2008/0089135 A1 * | 4/2008 | Ito | ............ | G11C 16/3445 365/185.29 |
| 2008/0117688 A1 | 5/2008 | Park et al. | | |
| 2008/0247240 A1 | 10/2008 | Lee | | |
| 2008/0298133 A1 | 12/2008 | Kim et al. | | |
| 2008/0316820 A1 | 12/2008 | Seol et al. | | |
| 2011/0026331 A1 * | 2/2011 | Dong | ............ | G11C 16/0483 365/185.19 |
| 2012/0008395 A1 * | 1/2012 | Kim | ............ | G11C 16/0483 365/185.11 |
| 2012/0113720 A1 * | 5/2012 | Kim | ............ | G11C 16/16 365/185.11 |
| 2014/0082460 A1 | 3/2014 | Pangal et al. | | |

OTHER PUBLICATIONS

International Preliminary Report on Patentability and Written Opinion received for International Application No. PCT/US2011/067810, dated Jul. 10, 2014, 7 pages.
International Search Report and Written Opinion received for International Application No. PCT/US2011/067810, dated Sep. 24, 2012, 13 pages.
Notice of Allowance received for U.S. Appl. No. 13/997,212, dated Mar. 23, 2016, 5 pages.
Office Action received for U.S. Appl. No. 13/997,212, dated Aug. 26, 2015, 17 pages.

* cited by examiner

DYNAMIC WINDOW TO IMPROVE NAND ENDURANCE

CROSS REFERENCE TO RELATED APPLICATION

The present application is a continuation U.S. application Ser. No. 13/997,212 filed on Dec. 3, 2013 which in turns claims benefit of International Application No. PCT/US2011/067810 filed on Dec. 29, 2011. Said application Ser. No. 13/997,212, and PCT/US2011/067810 are hereby incorporated herein by reference in their entirety.

FIELD

The present disclosure generally relates to the field of electronics. More particularly, some embodiments of the invention generally relate to provision of a dynamic window to improve NAND (Not And) memory endurance.

BACKGROUND

As processors increase their processing capabilities, one concern is the speed at which memory may be accessed by a processor. For example, to process data, a processor may need to first fetch data from a memory. After completion of the processing, the results may need to be stored in the memory. Therefore, the memory speed can have a direct effect on overall system performance.

Another important consideration is power consumption. For example, in mobile computing devices that rely on battery power, it is very important to reduce power consumption to allow for the device to operate while mobile. Power consumption is also important for non-mobile computing devices as excess power consumption may increase costs (e.g., due to additional power usage, increasing cooling requirements, etc.), shorten component life, limit locations at which a device may be used, etc.

Hard disk drives provide a relatively low cost storage solution and are used in many computing devices to provide non-volatile storage. Disk drives however use relatively a lot of power when compared to flash memory since a disk drive needs to spin its disks at a relatively high speed and move disk heads relative to the spinning disks to read/write data. All this physical movement generates heat and increases power consumption. To this end, higher end mobile devices are migrating towards utilizing flash memory devices that are non-volatile. Also, some flash memory devices may provide higher access speeds and data transfer rates than hard disk drives.

NAND memory is a type of flash memory that is non-volatile. NAND memory may be used in memory cards, flash drives, solid-state drives, and similar products. However, flash memory has a limitation on the number of times the information in a memory cell may be rewritten before it becomes unusable, or a finite number of program-erase cycles (typically written as P/E cycles).

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

Figure 1:
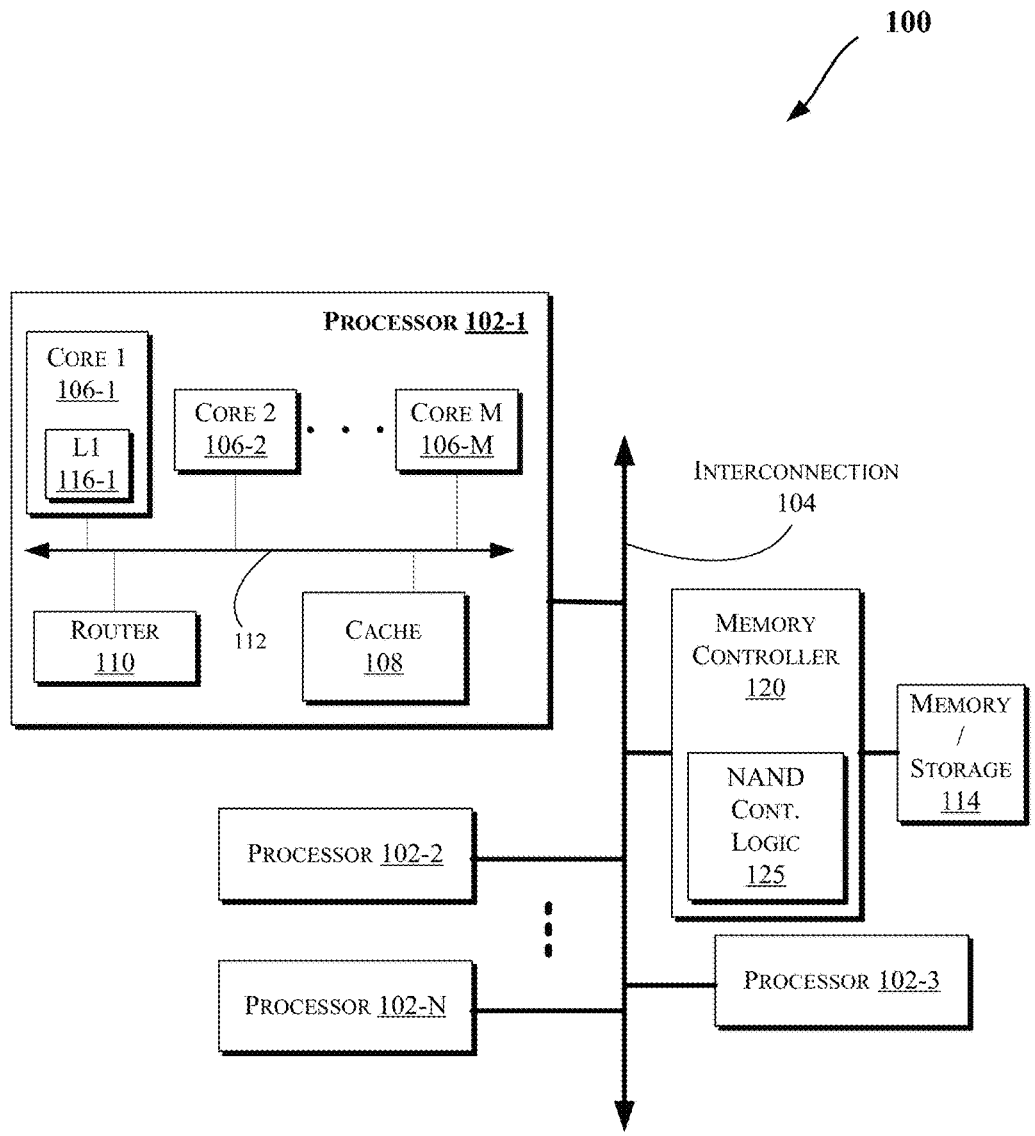
FIGS. 1, 8, and 9 illustrate block diagrams of embodiments of computing systems, which may be utilized to implement various embodiments discussed herein.

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

In an embodiment, a dynamic window is utilized to improve flash (e.g., NAND) memory endurance. Since program and erase operations involve electron transfer through the tunnel oxide separating the floating gate and active area and resulting charge trap-up, flash memory (including NAND or NOR memory) is limited by a finite number of program-erase cycles (typically written as P/E cycles). NAND memory may also be affected by program or read disturb where programming or accessing a NAND memory cell may cause other cells near the cell being read to be changed over time if the surrounding cells are not rewritten. Another issue with NAND flash memory is charge loss where a cell programmed to a specific level may lose charge over time and may appear during read to be in another level. To this end, some process and trim changes may be done to improve endurance, e.g., program-erase window is set to meet post-cycling disturb and charge loss requirements. However, current solutions do not use a program-erase window that is changed or shifted down dynamically with cycle count as done in accordance with some embodiments. Having a smaller window during the initial life of the NAND memory part in turn reduces the charge fluence and/or trap-up, which improves the overall endurance of the part. Shifting the window down with cycling also enables the use of a smaller erase voltage at time zero, thereby improving the trap-up and endurance in an embodiment.

In some embodiments, the charge trap-up (such as induced by program-erase cycling in a NAND flash cell) is reduced by dynamically varying or moving the program-erase window with average program/erase cycles on block or die in two ways: (1) dynamically varying the program-erase window by starting with a higher erase verify (TEV) voltage and lowering it with subsequent cycles; and/or (2) dynamically moving the window by starting with a higher program verify (PV) and erase verify (TEV) voltage and moving it down with subsequent cycles, e.g., keeping the delta between the two fixed. In the former case, trap-up improvement results from lower erase well voltage (Vwell) and cycling charge fluence during the initial life of the part. In the latter case, trap-up improvement results from a lower Vwell during the initial life of the part. The reduced trap-up will in turn result in improved reliability of the flash cell, including cycling endurance, program disturb, and/or charge loss over time.

In an embodiment, the NAND memory part starts operating with a trim profile, which is updated as a function of cycles or based on a trigger like block fail rate or near miss ECC (Error Correcting Code) event. A NAND controller logic has the capability to manage the different trim profiles and write these to the integrated circuit die based on the criterion mentioned above, in accordance with some embodiments. Accordingly, some embodiments improve cycling endurance and usable life of NAND flash die used in consumer (SD cards, USB memory stick etc) and compute (both client and enterprise) applications, as well as improve reliability and lower the read bit error rate after a specific number of cycles.

Moreover, the memory techniques discussed herein may be provided in various computing systems (e.g., including smart phones, tablets, portable game consoles, etc.), such as those discussed with reference to FIGS. 1-9. More particularly, FIG. 1 illustrates a block diagram of a computing system 100, according to an embodiment of the invention. The system 100 may include one or more processors 102-1 through 102-N (generally referred to herein as "processors 102" or "processor 102"). The processors 102 may communicate via an interconnection or bus 104. Each processor may include various components some of which are only discussed with reference to processor 102-1 for clarity. Accordingly, each of the remaining processors 102-2 through 102-N may include the same or similar components discussed with reference to the processor 102-1.

In an embodiment, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), memory controllers (such as those discussed with reference to FIGS. 8-9), or other components.

In one embodiment, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that are utilized by one or more components of the processor 102-1, such as the cores 106. For example, the cache 108 may locally cache data stored in a memory/storage 114 for faster access by the components of the processor 102. As shown in FIG. 1, the memory/storage 114 may be in communication with the processors 102 via the interconnection 104. In an embodiment, the cache 108 (that may be shared) may have various levels, for example, the cache 108 may be a mid-level cache and/or a last-level cache (LLC). Also, each of the cores 106 may include a level 1 (L1) cache (116-1) (generally referred to herein as "L1 cache 116"). Various components of the processor 102-1 may communicate with the cache 108 directly, through a bus (e.g., the bus 112), and/or a memory controller or hub.

As shown in FIG. 1, memory/storage 114 may be coupled to other components of system 100 through a memory controller 120. Memory/storage 114 may include flash memory such as NAND memory in some embodiments. Even though the memory controller 120 is shown to be coupled between the interconnection 102 and the memory 114, the memory controller 120 may be located elsewhere in system 100. For example, memory controller 120 or portions of it may be provided within one of the processors 102 in some embodiments. Also, in some embodiments, system 100 may include logic (e.g., NAND controller logic 125) to issue read or write requests to the memory/storage 114 in an optimal fashion, e.g., to improve flash memory reliability, including cycling endurance, program disturb, and/or charge loss over time, as will be further discussed herein.

Figure 2:
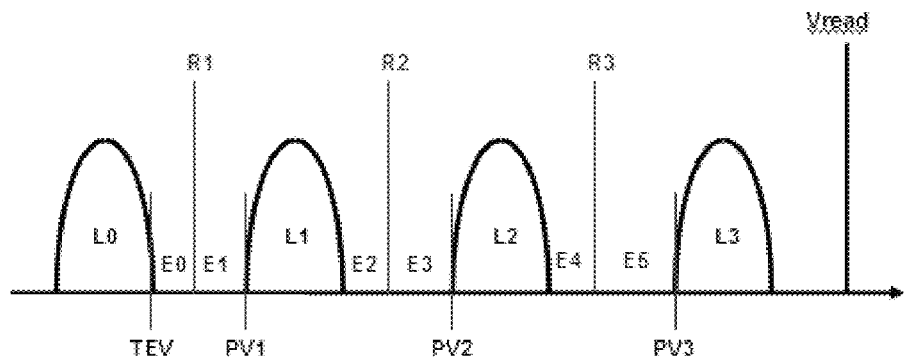
FIGS. 2 and 5-7 illustrate sample graphs according to some embodiments.

In an embodiment, the window in a flash NAND array may be engineered so that it meets the disturb and charge loss requirements at end of life. FIG. 2 shows sample erase verify (TEV), program verify (PV1, PV2, PV3), and read reference (R1, R2, R3) voltages that define a NAND Multi Level Cell (MLC) window, in accordance with some implementations. More particularly, a two-bit per cell window is shown where each cell may be programmed to any of four states. Upon erase, all cells in a block are erased to a threshold voltage (Vt) below TEV. Then the cells in the array are programmed to L1, L2, or L3, by placing the Vt above PV1, PV2, PV3, respectively.

Moreover, the read reference voltages (R1, R2, R3) and the state widths of the placed distributions determine the edge margins available. The even edges E0, E2, E4 determine the margin for program disturb and over-program, while the odd edges E1, E3, E5 determine the margin for charge loss. The sum of the edge margins E0 through E5 in FIG. 2 is usually defined as the Read Window Budget (RWB). A larger window between PV3 and TEV allows larger margins for E0 to E5, e.g., to read the cell correctly in the even of charge loss or disturb/over-program. The PV3 to TEV window is designed such that the above-mentioned margins will meet reliability requirements for a cycled block (end of life), which are generally worse than for an un-cycled block. The R3 value that is used may be dominated by charge loss, which may be intrinsic charge loss (ICL) which is trap-up dominated or single bit charge loss (SBCL) tail, which is a stress-induced leakage current (SILC) mechanism. In an embodiment, the early life window may be adjusted to reduce trap-up and improve overall endurance of the part.

Figure 3:
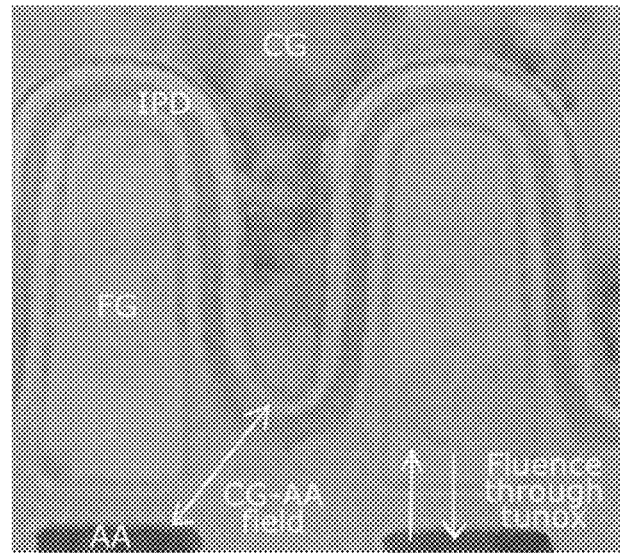
FIG. 3 illustrates a cross-section of a NAND cell that may be utilized in some embodiments.

In some embodiments, one of the factors that determine trap-up is the fluence of electrons through the cell during program and erase operations, which is determined by the PV3 to TEV window in FIG. 2. Another factor is the corner electric field between the control gate (CG) and active area (AA) which is determined by the maximum well voltage (Vwell) during erase. FIG. 3 shows the cross-section of a NAND cell with the active area (AA), floating gate (FG), inter-poly dielectric (IPD), and control gate (CG) identified. During erase the CG is grounded and a high voltage (about 12V to 25V) is applied on the well and active area, which in turn erases the cell by removing electrons from the floating gate through the tunnel oxide into the active area. Programming is done by grounding the active area and applying a positive voltage to the CG which transfers electrons from the AA to the FG. This charge fluence through the tunnel oxide (tunox) with each program and erase operation gradually degrades the oxide which in turn adversely affects the disturb and charge retention properties of the NAND array. The well voltage needed to pass erase verify is determined by the TEV voltage, e.g., with a higher Vwell needed for lower TEV. Use of a higher Vwell voltage in turn increases the CG-AA corner field which may be a source of trap-up, in addition to the tunnel oxide trap-up directly above the active area. While FIG. 3 shows a NAND cell structure with the control gate wrapped around the floating gate, the principles mentioned above area applicable for a planar cell as well. Since a lower TEV may be used to provide more window for the edges E0 to E5 of FIG. 2, some embodiments minimize the Vwell driven trap-up by using a higher TEV on a un-cycled block and reducing it as the part undergoes more cycles.

Some embodiments use a method to reduce cycling trap-up such as: (1) by reducing the fluence of electrons during cycling by starting with a smaller PV3 to TEV window, and gradually increasing it (by lowering TEV) as the cell undergoes more cycles; and/or (2) by reducing the impact of erase well voltage on trap-up, by starting with a higher PV/TEV, so that a smaller Vwell is used initially; and moving PV/TEV down as the cell is cycled keeping the PV to TEV delta fixed.

With respect to the embodiment of varying the PV to TEV window with cycles, the fluence of electrons in a flash cell during program-erase cycling is determined by the difference between erase verify and program verify voltages (window). For an SLC cell, a higher window between PV and TEV would allow a larger delta between the read reference and PV, to provide more margin to read the cell correctly in the even of charge loss from programmed state. The higher window also allows for a larger delta between TEV and read reference to provide more margin for program disturb. The same principle may be applied to MLC where cells are placed in multiple levels with multiple PVs and read reference voltages, as described above with reference to FIGS. 2-3. Some implementations keep the TEV and PV voltages (which determine the window) constant during the life of a part. Since metrics like program disturb and charge loss degrade with cycling, the window and read reference placement may be set up to support the worst case (post cycling) disturb or charge loss, the large window in turn results in worsening of the cycling trap-up and lowering endurance as a result of higher charge fluence.

An embodiment utilizes a dynamic window where the delta between TEV and PV is increased as the flash cell undergoes more cycles. This may be done by starting with a large erase verify voltage (TEV), so that the cell is erased shallower at the beginning of its life, and systematically lowering the TEV to erase deeper, as the cell has undergone more program erase cycles. Wear leveling which maintains the same number of cycles across all blocks on a die allows a common TEV level for the whole die. The total charge fluence and trap-up may then be improved compared to having a fixed wider window, e.g., improving the cycling capability of the part and also improving the program disturb and ICL (Intrinsic Charge Loss) capability at a specific cycle count.

Implementation may be done by using a plurality of (e.g., three or four) different trim profiles for the part which are changed after a fixed number of cycles and/or based on a trigger based criterion like Block Fail Rate (BFR) or ECC event (e.g., the number of failing bits). For instance, the part would start its life with trim profile A, which would be changed to profiles B, C, D, etc. by the controller based on the criterion above as the part has more cycles. For the variable TEV to PV window mentioned above, the trim profiles would include TEV, R1, PV1, R2, PV2, R3, program start voltage (Vpgm) and erase start voltage (Vera). All trims above may be decreased with cycles, except Vera which may be increased.

With respect to the dynamically shifting the window down with cycles embodiment, another factor which determines the trap-up degradation is the peak electric field during erase which is driven by the peak well voltage used during erase (FIGS. 2-3). For an un-cycled cell, the maximum well voltage may be reduced by increasing the erase verify voltage (TEV), which will let the NAND string pass erase verify with a shallower erase. To maintain RWB (Read Window Budget, or sum of E0 through E5 margins) and program disturb margin, the PV and read voltages of the other levels may be raised by the same value by which TEV is raised. The higher PV and R (read reference voltage) at time zero would be able to support the un-cycled SBCL, since SBCL for an un-cycled cell is significantly better than for a cycled cell. And, using a smaller erase voltage at time zero results in a smaller trap-up. Calculations show about 40% improvement in trap-up at 30 k cycles if the window is setup 2V higher so that the starting erase voltage is 12V rather than 14V.

Various implementation may be done by using trim profiles which are changed based on cycles or a trigger based criterion as discussed above. For the dynamically shifting window, the trim profiles may include TEV, R1, PV1, R2, PV2, R3, PV3, program start voltage (Vpgm), erase start voltage (Vera), and the unselected WL (Word Line) read voltage (Vread/Vpassr). The trims above may be decreased with cycles, except Vera which may be increased. The PV/R shift may be accomplished by increasing only the source bias trim in the profiles above. Other trims above may be changed independently.

Figure 4:
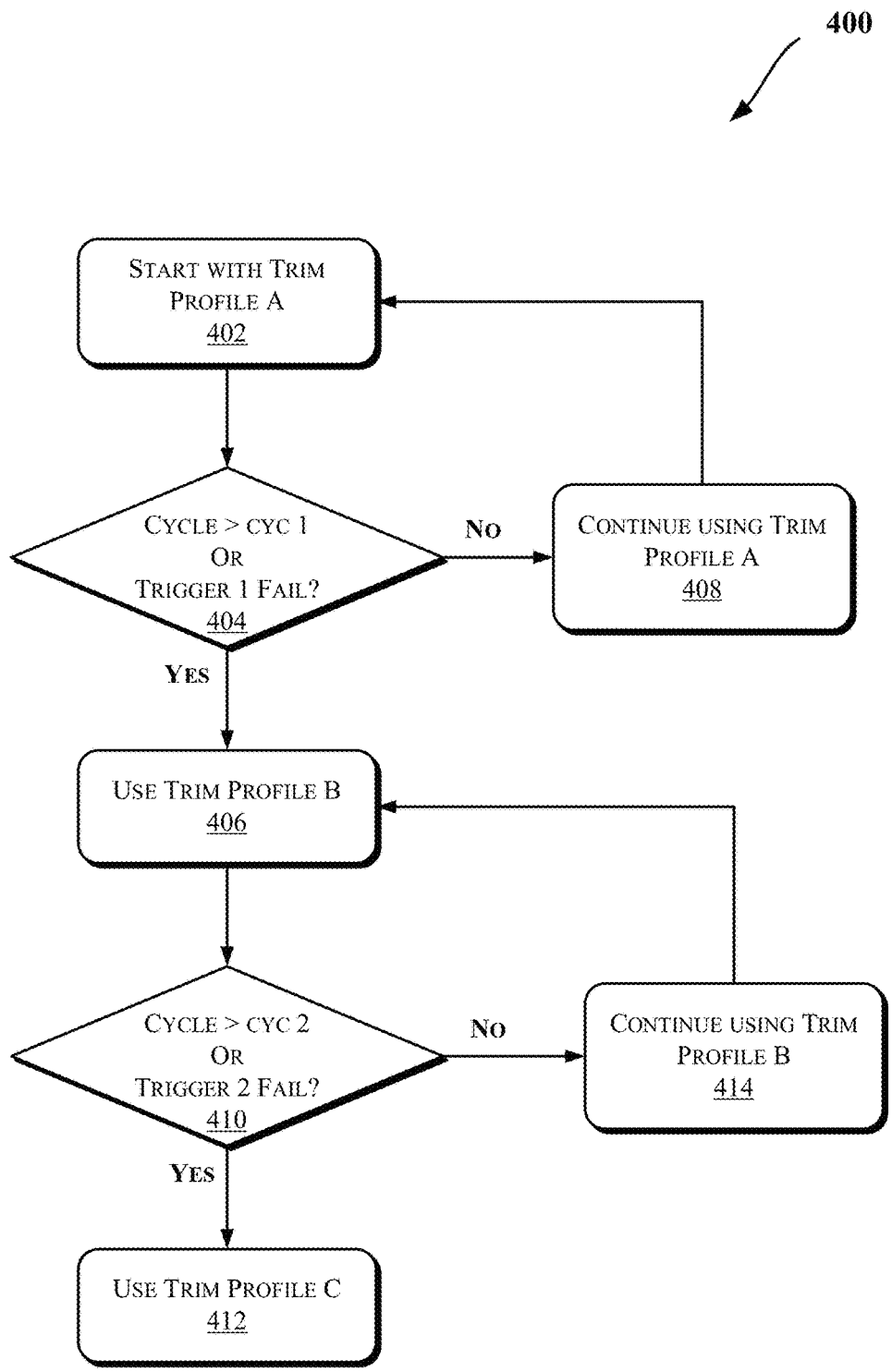
FIG. 4 illustrates a flow diagram of a method in accordance with an embodiment of the invention.

FIG. 4 illustrates a flow diagram of a method 400 to implementation a decision tree used to switch to different trim profiles, in accordance with an embodiment of the invention. In an embodiment, various components discussed with reference to FIGS. 1-3 and 5-9 may be utilized to perform one or more of the operations discussed with reference to FIG. 4.

Referring to FIGS. 1-4, at an operation 402, a first trim profile (e.g., profile A) is applied (e.g., by the controller logic 125). At an operation 404, if the current cycle count has reached a first cycle threshold (Cyc 1) or a failure trigger occurs (such as Block Fail Rate (BFR) threshold value or (e.g., near miss) ECC event), a second trim profile (e.g., profile B) is applied (e.g., by the controller logic 125) at an operation 406. Otherwise, an operation 408 continues to use trim profile A. Accordingly, in at least one embodiment, a current count of the number of cycles executed on the flash device may be kept in a storage device, register, etc. (e.g., either by the logic 125 or at its direction).

At an operation 410, if the current cycle count has reached a second cycle threshold (Cyc 2) or a failure trigger occurs (such as BFR value or (e.g., near miss) ECC event), a third trim profile (e.g., profile C) is applied (e.g., by the controller logic 125) at an operation 412. Otherwise, an operation 414 continues to use trim profile B. The method continues the process set forth above for application of additional trim profiles as needed.

Figure 5:
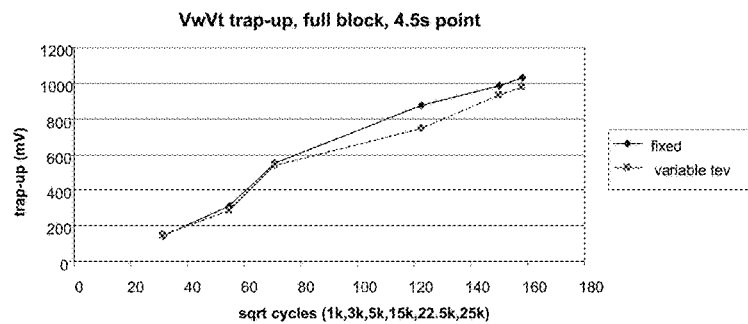
Figure 6:
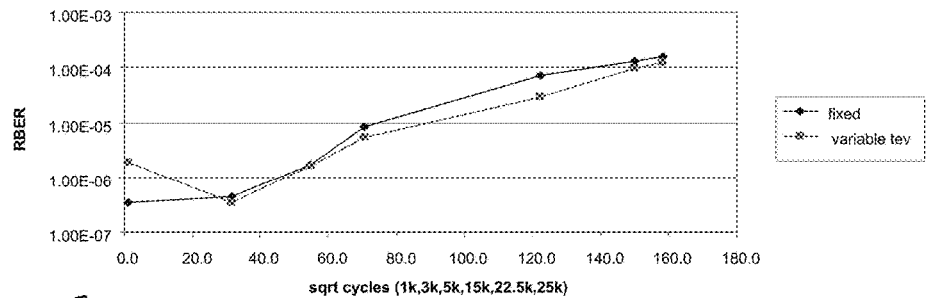

FIGS. 5 and 6 illustrate sample graphs showing improvement in cycling trap-up and program disturb seen on 34 nm SLC products when a variable window is used for cycling instead of fixed window, using methodology (1) described above. For fixed window cycling, cycling may be done up to 25 k cycles with a fixed TEV of 1.5V. For variable window cycling, an initial TEV of 2.5V may be used, which is dropped in steps of 0.2V at cycles 1 k, 3 k, 7.5 k, 15 k, 22.5 k, for a final TEV of 1.5V. At 25 k cycles, the improvement in PD RBER (Program Disturb Read Bit Error Rate) with variable window cycling is about 25%. The improvement in VwVt trap-up may be approximately 5%. The trap-up and RBER improvements, as well as the block fail rate improvements resulting from the trap-up improvements are expected to be higher as NAND technology scales to smaller dimensions.

Figure 7:
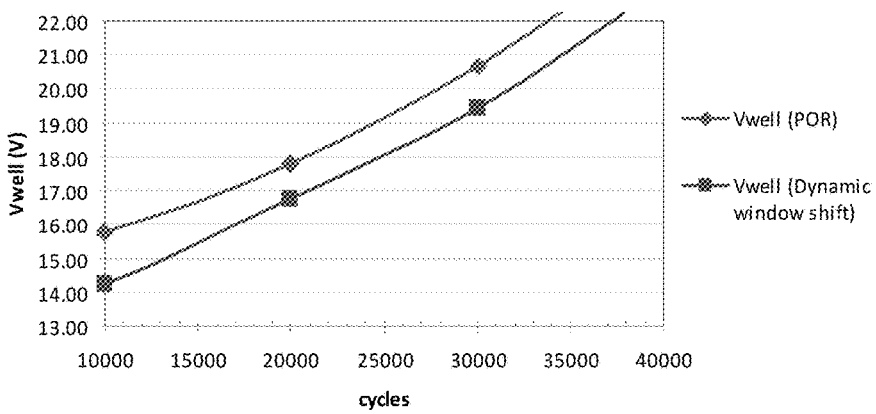

FIG. 7 illustrates Vwell voltage step-up for POR (Process Of Record) and dynamic window shift showing blow-up for cycles 10 k to 40 k, according to an embodiment. Moreover, Table 1 below and FIG. 7 show some theoretical calculations of Vwell voltage step up to erase a block, comparing a fixed window, to a dynamically shifting window which is setup 2V higher at time 0. Assumptions are that trap-up and SBCL have a power law dependence on cycles with slope/power of 8 e-4/0.5 for trap-up and 4.4 e-3/0.5 for SBCL. The well voltage starts 2V lower (12V vs. 14V), and results in a 2V lower SBCL margin at time 0. But due to the improved trap-up resulting from lower Vwell, there is a net trap-up improvement of 40% at 30 k cycles, when SBCL margin is matched as shown in Table 1 below.

| Cycles | Vwell (POR) | Vwell (Dynamic window shift) | Delta R3 | Delta Vwell | Cycling gain |
|---|---|---|---|---|---|
| 1 | 14.00 | 12.00 | 2.00 | 2.00 | |
| 10 | 14.04 | 12.04 | 1.99 | 1.99 | |
| 100 | 14.15 | 12.19 | 1.94 | 1.96 | |
| 1000 | 14.52 | 12.64 | 1.80 | 1.87 | |
| 10000 | 15.78 | 14.22 | 1.36 | 1.56 | |
| 20000 | 17.79 | 16.74 | 0.74 | 1.05 | |
| 30000 | 20.65 | 19.43 | −0.02 | 1.22 | 1.40 |

Figure 8:
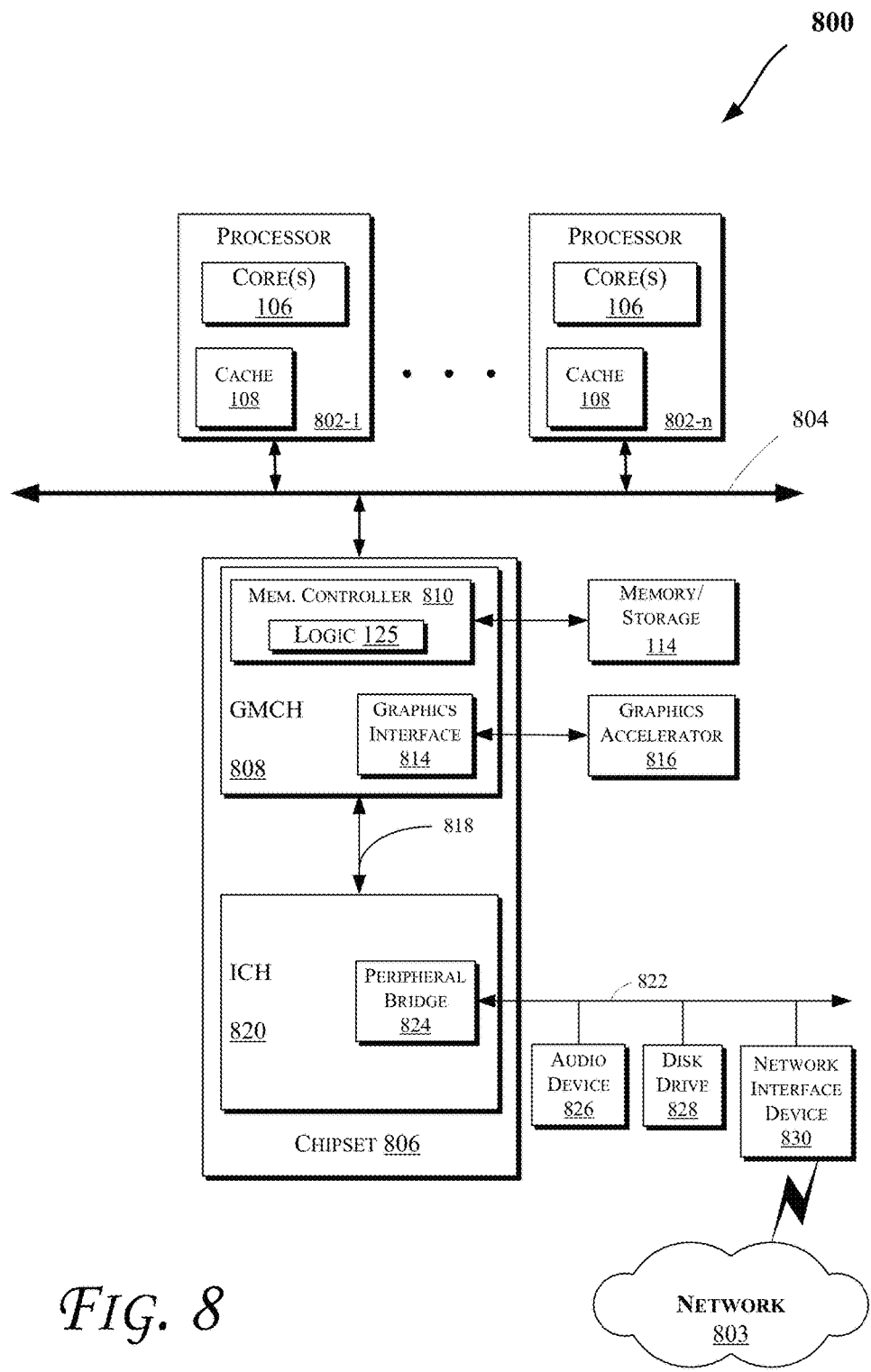

FIG. 8 illustrates a block diagram of a computing system 800 in accordance with an embodiment of the invention. The computing system 800 may include one or more central processing unit(s) (CPUs) 802 or processors that communicate via an interconnection network (or bus) 804. The processors 802 may include a general purpose processor, a network processor (that processes data communicated over a computer network 803), an application processor (such as those used in cell phones, smart phones, etc.), or other types of a processor (including a reduced instruction set computer (RISC) processor or a complex instruction set computer (CISC)). Various types of computer networks 803 may be utilized including wired (e.g., Ethernet, Gigabit, Fiber, etc.) or wireless networks (such as cellular, 3G (Third-Generation Cell-Phone Technology or 3rd Generation Wireless Format (UWCC)), 4G, Low Power Embedded (LPE), etc.). Moreover, the processors 802 may have a single or multiple core design. The processors 802 with a multiple core design may integrate different types of processor cores on the same integrated circuit (IC) die. Also, the processors 802 with a multiple core design may be implemented as symmetrical or asymmetrical multiprocessors.

In an embodiment, one or more of the processors 802 may be the same or similar to the processors 102 of FIG. 1. For example, one or more of the processors 802 may include one or more of the cores 106 and/or cache 108. Also, the operations discussed with reference to FIGS. 1-7 may be performed by one or more components of the system 800.

A chipset 806 may also communicate with the interconnection network 804. The chipset 806 may include a graphics and memory control hub (GMCH) 808. The GMCH 808 may include a memory controller 810 (which may be the same or similar to the memory controller 120 of FIG. 1 in an embodiment, e.g., including the logic 125) that communicates with the memory 114. The memory 114 may store data, including sequences of instructions that are executed by the CPU 802, or any other device included in the computing system 800. In one embodiment of the invention, the memory 114 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk or NAND based solid-state drive. Additional devices may communicate via the interconnection network 804, such as multiple CPUs and/or multiple system memories.

The GMCH 808 may also include a graphics interface 814 that communicates with a graphics accelerator 816. In one embodiment of the invention, the graphics interface 814 may communicate with the graphics accelerator 816 via an accelerated graphics port (AGP). In an embodiment of the invention, a display (such as a flat panel display) may communicate with the graphics interface 814 through, for example, a signal converter that translates a digital representation of an image stored in a storage device such as video memory or system memory into display signals that are interpreted and displayed by the display. The display signals produced by the display device may pass through various control devices before being interpreted by and subsequently displayed on the display.

A hub interface 818 may allow the GMCH 808 and an input/output control hub (ICH) 820 to communicate. The ICH 820 may provide an interface to I/O devices that communicate with the computing system 800. The ICH 820 may communicate with a bus 822 through a peripheral bridge (or controller) 824, such as a peripheral component interconnect (PCI) bridge, a universal serial bus (USB) controller, or other types of peripheral bridges or controllers. The bridge 824 may provide a data path between the CPU 802 and peripheral devices. Other types of topologies may be utilized. Also, multiple buses may communicate with the ICH 820, e.g., through multiple bridges or controllers. Moreover, other peripherals in communication with the ICH 820 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 822 may communicate with an audio device 826, one or more disk drive(s) 828, and a network interface device 830 (which is in communication with the computer network 803). Other devices may communicate via the bus 822. Also, various components (such as the network interface device 830) may communicate with the GMCH 808 in some embodiments of the invention. In addition, the processor 802 and the GMCH 808 may be combined to form a single chip. Furthermore, the graphics accelerator 816 may be included within the GMCH 808 in other embodiments of the invention.

Furthermore, the computing system 800 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (which may be a magnetic hard disk drive or a NAND flash memory based solid state drive) (e.g., 828), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 9:
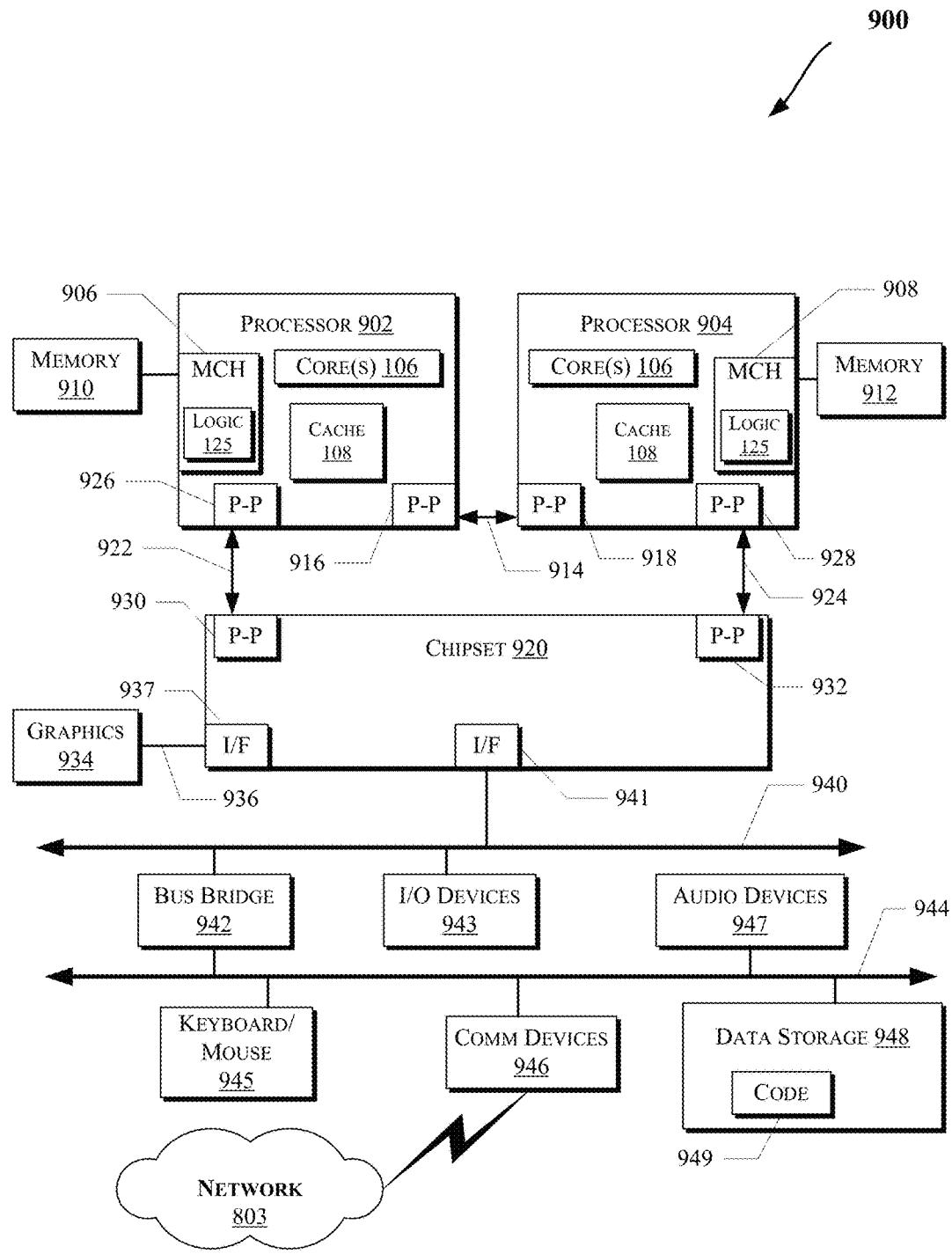

FIG. 9 illustrates a computing system 900 that is arranged in a point-to-point (PtP) configuration, according to an embodiment of the invention. In particular, FIG. 9 shows a system where processors, memory, and input/output devices are interconnected by a number of point-to-point interfaces. The operations discussed with reference to FIGS. 1-8 may be performed by one or more components of the system 900.

As illustrated in FIG. 9, the system 900 may include several processors, of which only two, processors 902 and 904 are shown for clarity. The processors 902 and 904 may each include a local memory controller hub (MCH) 906 and 908 to enable communication with memories 910 and 912. The memories 910 and/or 912 may store various data such as those discussed with reference to the memory 114 of FIGS. 1 and/or 8. Also, MCH 906 and 908 may include the memory controller 120 and/or logic 125 of FIG. 1 in some embodiments.

In an embodiment, the processors 902 and 904 may be one of the processors 802 discussed with reference to FIG. 8. The processors 902 and 904 may exchange data via a point-to-point (PtP) interface 914 using PtP interface circuits 916 and 918, respectively. Also, the processors 902 and 904 may each exchange data with a chipset 920 via individual PtP interfaces 922 and 924 using point-to-point interface circuits 926, 928, 930, and 932. The chipset 920 may further exchange data with a high-performance graphics circuit 934 via a high-performance graphics interface 936, e.g., using a PtP interface circuit 937.

As shown in FIG. 9, one or more of the cores 106 and/or cache 108 of FIG. 1 may be located within the processors 902 and 904. Other embodiments of the invention, however, may exist in other circuits, logic units, or devices within the system 900 of FIG. 9. Furthermore, other embodiments of the invention may be distributed throughout several circuits, logic units, or devices illustrated in FIG. 9.

The chipset 920 may communicate with a bus 940 using a PtP interface circuit 941. The bus 940 may have one or more devices that communicate with it, such as a bus bridge 942 and I/O devices 943. Via a bus 944, the bus bridge 943 may communicate with other devices such as a keyboard/mouse 945, communication devices 946 (such as modems, network interface devices, or other communication devices that may communicate with the computer network 803), audio I/O device, and/or a data storage device 948. The data storage device 948 (which may be a hard disk drive or a NAND flash based solid state drive) may store code 949 that may be executed by the processors 902 and/or 904.

In various embodiments of the invention, the operations discussed herein, e.g., with reference to FIGS. 1-9, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed with respect to FIGS. 1-9.

Additionally, such tangible computer-readable media may be downloaded as a computer program product, wherein the program may be transferred from a remote computer (e.g., a server) to a requesting computer (e.g., a client) by way of data signals (such as in a carrier wave or other propagation medium) via a communication link (e.g., a bus, a modem, or a network connection).

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An apparatus comprising:
   memory controller logic to apply a first trim profile to a flash memory storage device; and
   the first trim profile to dynamically cause a program-erase window to vary by starting with an initial value and to modify the initial value with subsequent cycles over a life of the flash memory storage device based on a current cycle count value,
   wherein the memory controller logic is to apply a second trim profile to the flash memory storage device in response to a determination that the current cycle count value has exceeded a threshold value or in response to occurrence of a failure condition, wherein the first trim profile or the second trim profile is to comprise one or more of: verify voltages, programming voltages, erase voltages, unselected WL (Word Line) read voltages, and erase or program pulse duration, wherein a smaller program-erase window is to be utilized during an initial life of the flash memory storage device.

2. The apparatus of claim 1, wherein the occurrence of the failure condition is to be detected based on a ECC (Error Correcting Code) event.

3. The apparatus of claim 1, wherein the occurrence of the failure condition is to be detected based on a Block Fail Rate (BFR) value.

4. The apparatus of claim 1, further comprising a storage device or register to store the current cycle count value.

5. The apparatus of claim 1, wherein the flash memory storage device is to comprise a NAND storage device.

6. The apparatus of claim 1, wherein the program-erase window corresponds to a Multi Level Cell (MLC) window.

7. The apparatus of claim 1, wherein one or more processor cores are coupled to the memory controller logic to access data stored in the flash memory storage device.

8. A method comprising:
   applying a first trim profile to a flash memory storage device by memory controller logic, wherein the first trim profile dynamically causes a program-erase window to vary by starting with an initial value and modifying the initial value with subsequent cycles over a life of the flash memory storage device based on a current cycle count value;

applying a second trim profile to the flash memory storage device in response to a determination that the current cycle count value has exceeded a threshold value or in response to occurrence of a failure condition, wherein the first trim profile or the second trim profile comprises one or more of: verify voltages, programming voltages, erase voltages, unselected WL (Word Line) read voltages, and erase or program pulse duration, wherein a smaller program-erase window is utilized during an initial life of the flash memory storage device.

9. The method of claim 8, further comprising detecting the occurrence of the failure condition based on a ECC (Error Correcting Code) event.

10. The method of claim 8, further comprising detecting the occurrence of the failure condition based on a Block Fail Rate (BFR) value.

11. One or more non-transitory computer-readable medium comprising one or more instructions that when executed on at least one a processor configure the at least one processor to perform one or more operations to:

apply a first trim profile to a flash memory storage device by memory controller logic, wherein the first trim profile dynamically causes a program-erase window to vary by starting with an initial value and modifying the initial value with subsequent cycles over a life of the flash memory storage device based on a current cycle count value;

apply a second trim profile to the flash memory storage device in response to a determination that the current cycle count value has exceeded a threshold value or in response to occurrence of a failure condition, wherein the first trim profile or the second trim profile comprises one or more of: verify voltages, programming voltages, erase voltages, unselected WL (Word Line) read voltages, and erase or program pulse duration, wherein one or more instructions, when executed on the at least one processor, are to configure the at least one processor to perform one or more operations to cause utilization of a smaller program-erase window during an initial life of the flash memory storage device.

12. The one or more non-transitory computer-readable medium of claim 11, further comprising one or more instructions that when executed on the at least one processor configure the at least one processor to perform one or more operations to cause detection of the occurrence of the failure condition based on a ECC (Error Correcting Code) event.

13. The one or more non-transitory computer-readable medium of claim 11, further comprising one or more instructions that when executed on the at least one processor configure the at least one processor to perform one or more operations to cause detection of the occurrence of the failure condition based on a Block Fail Rate (BFR) value.

14. A system comprising:

a NAND memory having a plurality of memory cells;

a processor to access the NAND memory; and

NAND memory controller logic to apply a first trim profile to the NAND memory, the first trim profile to dynamically cause a program-erase window to vary by starting with an initial value and modifying the initial value with subsequent cycles over a life of the NAND memory based on a current cycle count value, wherein the NAND memory controller logic is to apply a second trim profile to the NAND memory in response to a determination that the current cycle count value has exceeded a threshold value or in response to occurrence of a failure condition wherein the first trim profile or the second trim profile is to comprise one or more of: verify voltages, programming voltages, erase voltages, unselected WL (Word Line) read voltages, and erase or program pulse duration, wherein a smaller program-erase window is to be utilized during an initial life of the NAND memory.

15. The system of claim 14, wherein the occurrence of the failure condition is to be detected based on a ECC (Error Correcting Code) event.

16. The system of claim 14, wherein the occurrence of the failure condition is to be detected based on a Block Fail Rate (BFR) value.

* * * * *